US006224934B1

United States Patent
Hasei et al.

(10) Patent No.: US 6,224,934 B1
(45) Date of Patent: May 1, 2001

(54) OZONE-PROCESSING APPARATUS FOR SEMICONDUCTOR PROCESS SYSTEM

(75) Inventors: Masaaki Hasei, Tsukui-gun; Kenji Ishikawa, Sagamihara; Qian Shao Shou, Sagamihara; Tetsuya Nakano, Sagamihara, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/587,571

(22) Filed: Jun. 6, 2000

(30) Foreign Application Priority Data

Jun. 7, 1999 (JP) .................................................. 11-15885

(51) Int. Cl.[7] .................................................. C23C 16/00
(52) U.S. Cl. ........................ 427/10; 427/255.27; 427/582; 427/583; 118/712; 118/715; 118/722
(58) Field of Search ..................................... 118/712, 715, 118/722; 427/10, 255.27, 582, 583

(56) References Cited

U.S. PATENT DOCUMENTS 4,711,790 * 12/1987 Morishige ............................. 427/582
6,143,081 * 11/2000 Shinriki ................................. 118/715
6,159,297 * 12/2000 Herchen ................................. 118/715

* cited by examiner

Primary Examiner—Richard Bueker
(74) Attorney, Agent, or Firm—Oblon, Spivak, McClelland, Maier & Neustadt, P.C.

(57) ABSTRACT

An ozone-processing apparatus for a semiconductor process system includes an airtight process chamber and a lamp chamber, which are partitioned by a window for transmitting ultraviolet rays. A plurality of ultraviolet-ray lamps is arrayed along the window in the lamp chamber. A measurement space is defined between the window and the lamps in the lamp chamber. The lamp chamber is provided with a mount portion to set up a measuring unit therein. The measuring unit includes a sensor to be inserted into the measuring space, for measuring the light quantity of the lamps. The sensor is movable in a direction in which the lamps are arrayed.

22 Claims, 4 Drawing Sheets

OZONE-PROCESSING APPARATUS FOR SEMICONDUCTOR PROCESS SYSTEM

CROSS-REFERENCE TO RELATED APPLICATIONS

This application is based upon and claims the benefit of priority from the prior Japanese Patent Application No. 11-158851, filed Jun. 7, 1999 the entire contents of which are incorporated herein by reference.

BACKGROUND OF THE INVENTION

The present invention relates to an ozone-processing apparatus for a semiconductor process system, and particularly, to an ozone-processing apparatus for subjecting a target substrate, such as a semiconductor wafer, to an oxidizing process or a reforming process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In the manufacturing process of a semiconductor device, activated oxygen atoms (oxygen radicals) are used, when a target substrate, such as a semiconductor wafer, is subjected to an oxidizing process or a reforming process. In such a case, ozone ($O_3$) gas is supplied to a process chamber accommodating the target substrate, and is activated by, e.g., an ultraviolet-ray (UV) lamp to generate oxygen radicals.

U.S. Pat. Appln. Ser. No. 08/889,590 (Jpn. Pat. Appln. KOKAI Publication No. 10-79377) discloses a processing apparatus of this type. The apparatus includes a process chamber with an ultraviolet-ray transmission window arranged in a wall defining the chamber, and UV lamps facing the window. The UV lamps are accommodated in a lamp chamber arranged on the process chamber. During a process, ozone in a process gas supplied into the process chamber is activated by ultraviolet rays emitted from the UV lamps. Thus, oxygen atoms (oxygen radicals) are generated and used for processing a semiconductor wafer placed in the process chamber.

Where activated oxygen (O*) is generated from ozone by Uv lamps, the light quantity of the UV lamps influences the quality of a processed target substrate. The light quantity of the UV lamps has to be properly measured to see whether the UV lamps degrade or not. Conventionally, during intervals between processes, the lid of a port formed on a process chamber is opened, and a light-quantity sensor attached to a rod-like jig is inserted therethrough, to measure the light quantity of UV lamps.

This measuring method, however, causes the interior of the process chamber, which has been supplied with ozone, to be exposed to the atmosphere, and thus may deteriorate the processing environment in the process chamber and the operation environment around the process chamber. Furthermore, it is necessary to purge the process chamber with nitrogen gas prior to the lid of the port being opened, and thus the operation becomes complicated and time-consuming, thereby increasing the operation cost and the downtime of the apparatus.

BRIEF SUMMARY OF THE INVENTION

In an ozone-processing apparatus for a semiconductor process system, in which a process is performed while ozone gas is excited by ultraviolet rays, an object of the present invention is to prevent the processing environment in a process chamber and the operation environment around a process chamber from being deteriorated, when the light quantity of the ultraviolet rays is measured.

In an ozone-processing apparatus for a semiconductor process system, in which a process is performed while ozone gas is excited by ultraviolet rays, another object of the present invention is to make the operation of measuring the light quantity of the ultraviolet rays easier, so that the operation cost and the downtime of the apparatus are reduced.

According to a first aspect of the present invention, there is provided an ozone-processing apparatus for a semiconductor process system, comprising:

an airtight process chamber;

a support member configured to support a target substrate within the process chamber;

a supply mechanism configured to supply a process gas containing ozone into the process chamber;

an exhaust mechanism configured to exhaust the process chamber;

a window configured to transmit ultraviolet rays and formed in a wall defining the process chamber;

an auxiliary chamber arranged on the process chamber, such that the process and auxiliary chambers are partitioned by the window;

a light source configured to emit ultraviolet rays and disposed in the auxiliary chamber to face the window, such that a measurement space is defined between the window and the light source in the auxiliary chamber; and a measuring unit including a sensor configured to measure light quantity of the light source, and to be detachably inserted into the measurement space.

According to a second aspect of the present invention, there is provided an ozone-processing apparatus for a semiconductor process system, comprising:

an airtight process chamber;

a support member configured to support a target substrate within the process chamber;

a supply mechanism configured to supply a process gas containing ozone into the process chamber;

an exhaust mechanism configured to exhaust the process chamber;

a window configured to transmit ultraviolet rays and formed in a wall defining the process chamber;

an auxiliary chamber arranged on the process chamber, such that the process and auxiliary chambers are partitioned by the window;

a light source configured to emit ultraviolet rays and disposed in the auxiliary chamber to face the window, such that a measurement space is defined between the window and the light source in the auxiliary chamber, the light source comprising a plurality of ultraviolet-ray lamps arrayed along the window and in a first direction; and a measuring unit including a sensor configured to measure light quantity of the light source, and to be detachably inserted into the measurement space, the measuring unit comprising an arm supporting the sensor, and a first guide configured to guide the arm such that the arm is movable substantially parallel to the window and in the first direction.

According to a third aspect of the present invention, there is provided a method of measuring light quantity of ultraviolet rays in an ozone-processing apparatus for a semiconductor process system, wherein the apparatus comprises an airtight process chamber,
a support member configured to support a target substrate within the process chamber,
a supply mechanism configured to supply a process gas containing ozone into the process chamber,
an exhaust mechanism configured to exhaust the process chamber,
a window configured to transmit ultraviolet rays and formed in a wall defining the process chamber,
an auxiliary chamber arranged on the process chamber, such that the process and auxiliary chambers are partitioned by the window, and
a light source configured to emit ultraviolet rays and disposed in the auxiliary chamber to face the window,
the method comprising the steps of:
securing a measurement space between the window and the light source in the auxiliary chamber, such that a sensor configured to measure light quantity of the light source is detachably inserted into the measurement space;
inserting the sensor into the measurement space from outside of the measurement space; and
measuring the light quantity of the light source by the sensor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
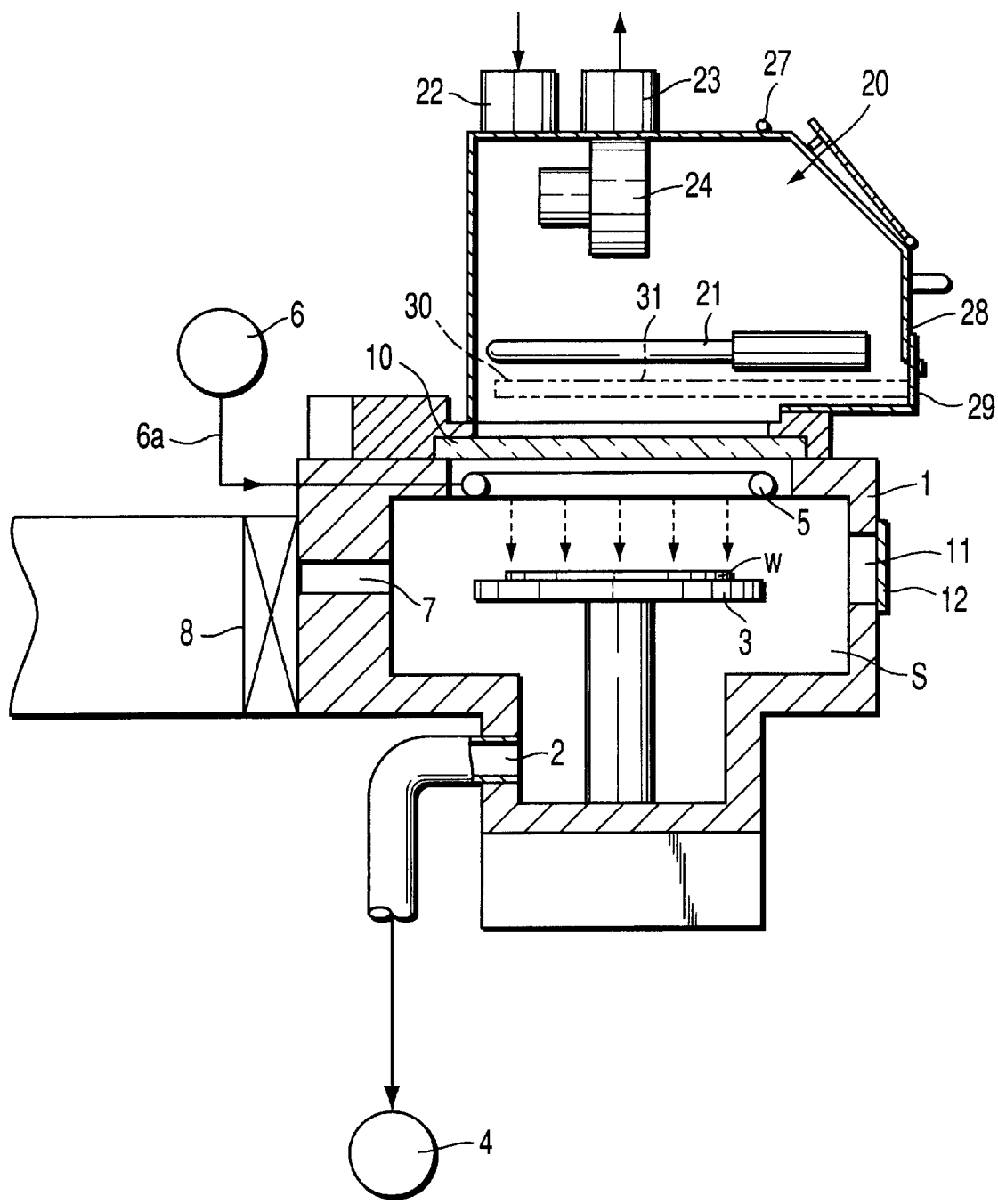
FIG. 1 is a sectional side view showing an ozone-processing apparatus for a semiconductor process system according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional side view showing an ozone-processing apparatus for a semiconductor process system according to an embodiment of the present invention. This apparatus is constituted as a single-substrate-oxidizing apparatus for subjecting semiconductor wafers to an oxidizing process one by one.

As shown in FIG. 1, this apparatus includes an airtight process chamber 1 made of a metal, such as aluminum having an oxidized inner surface treated by an anodizing process. The process chamber 1 is provided with an exhaust port 2 at the bottom. The exhaust port 2 is connected to an exhaust system including a vacuum pump, a pressure controller, etc., so that the interior of the process chamber 1 can be exhausted to a certain reduced pressure.

A rotatable worktable 3 is arranged in the process chamber 1. A semiconductor wafer W, i.e., a target substrate, is mounted on the top surface of the worktable 3 and is attracted and held by an electrostatic chuck (not shown). The worktable 3 is provided with a heater (not shown) embedded therein, so that the wafer W mounted thereon can be heated to a certain temperature.

A showerhead 5 is arranged below the ceiling of the process chamber 1 to supply a process gas containing ozone ($O_3$) as the main component into a process field S. The showerhead 5 is made of a material that is heat-resistant and ultraviolet-ray-transmissible, such as quartz. A number of gas spouting holes (not shown) are formed in the showerhead 5 to spout the process gas fed in the showerhead 5 toward the target surface or top surface of the wafer W. The showerhead 5 is connected to a gas supply system 6 for supplying the process gas through a gas supply pipe 6a.

In the gas supply system, the gas supply pipe 6a is connected to a conventional ozone generator (not shown) through a mass-flow controller (not shown). The ozone generator is supplied with a raw material gas containing oxygen gas as a material for generating ozone, and a small amount of an additive gas, such as N2 gas, for improving the generation efficiency.

A circular opening having a diameter larger than that of the wafer W is formed in the ceiling of the process chamber 1. The opening is airtightly closed by an ultraviolet-ray transmission window 10 made of a material that transmits ultraviolet rays, such as quartz, and arranged to face the top surface of the worktable 3 and to be parallel thereto. A box-like lamp chamber or auxiliary chamber 20 is arranged on the process chamber 1 such that the chambers 1 and 20 are partitioned by the window 10.

In the lamp chamber 20, there is a light source for radiating ultraviolet rays toward the process chamber 1. The light source includes a plurality of, e.g., four, ultraviolet-ray (UV) lamps 21 arrayed to face the window 10 and to be parallel thereto. Ultraviolet rays emitted from the lamps 21 are radiated to the atmosphere inside the process chamber 1 through the window 10, thereby dissociating ozone in the atmosphere to generate activated oxygen.

The lamps 21 can efficiently emit ultraviolet rays when the surface temperature of the lamps 21 falls in a certain range. For this reason, the lamp chamber 20 is provided with a gas supply port 22, an exhaust port 23, and a blower 24 for forcedly ventilating the chamber 20, to cool the surfaces of the lamps 21 and keep their temperature constant. The exhaust port 23 is connected to the heat exhaust line (not shown) of the factory.

An opening for loading/unloading the wafer W is formed in one sidewall of the process chamber 1, and is opened/closed by a gate valve 8. An opening 11 for auxiliary operations is formed in another sidewall of the process chamber, and is opened/closed by a lid 12. According to a conventional technique, a light-quantity sensor for measuring the light quantity of ultraviolet rays is inserted into the process chamber 1 through this opening 11.

Figure 2:
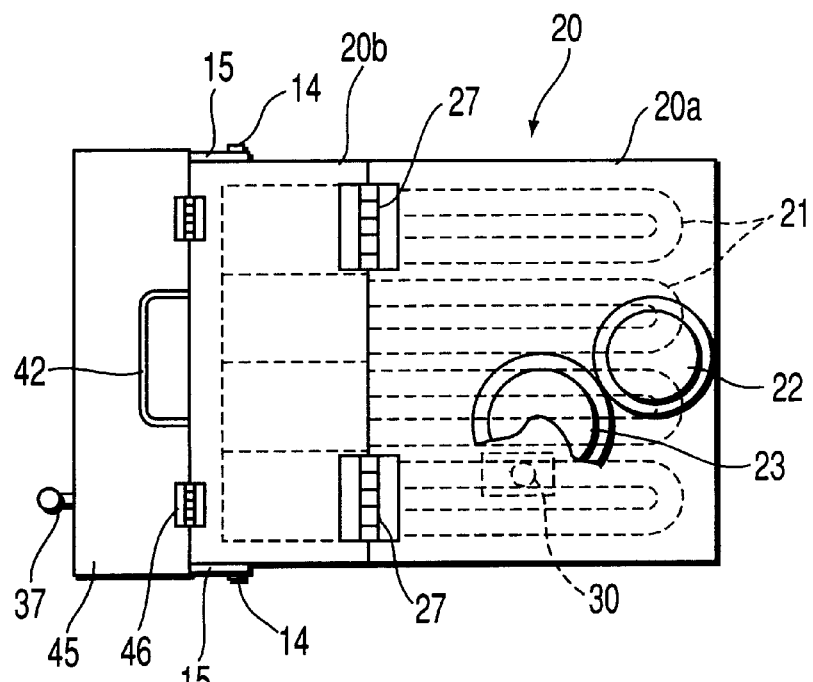
FIG. 2 is a plan view showing a lamp chamber used in the apparatus show in FIG. 1, in a state where a measuring unit is attached to the lamp chamber.
Figure 3:
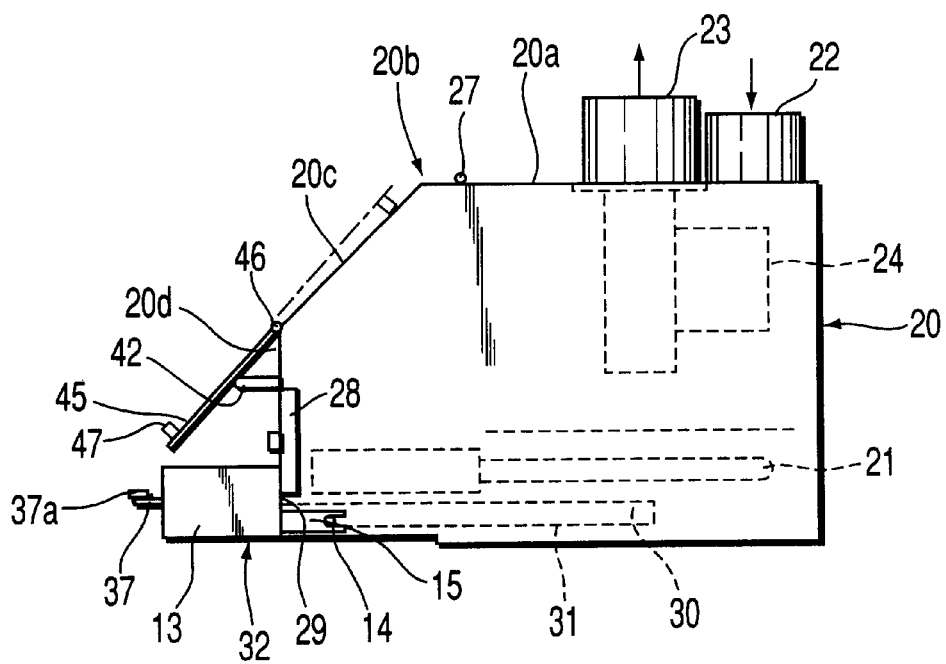
FIG. 3 is a side view showing the lamp chamber of the apparatus shown in FIG. 1, in the state shown in FIG. 2.
Figure 4:
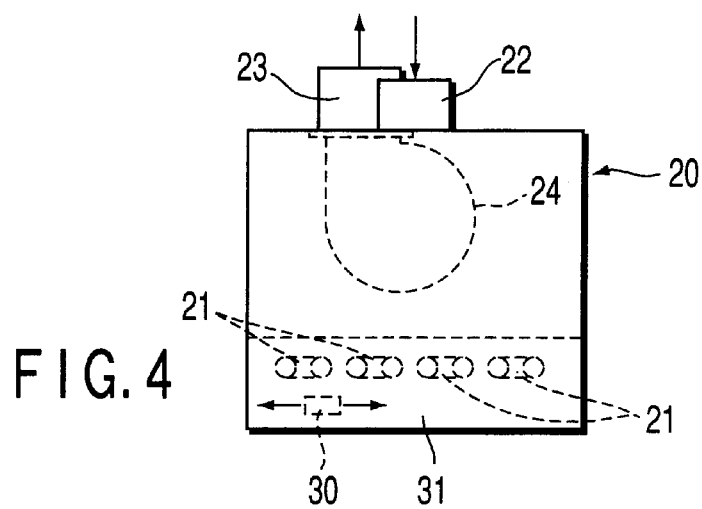
FIG. 4 is a rear view showing the lamp chamber of the apparatus shown in FIG. 1, in the state shown in FIG. 2.

FIGS. 2 to 4 are a plan view, a side view, and a rear view, respectively, showing the lamp chamber 20 used in the apparatus show in FIG. 1, in a state where a measuring unit 50 is attached to the lamp chamber 20. The lamp chamber 20 includes a trapezoidal box-like main portion 20a fixed to the process chamber 1, and a front cover 20b, which can be opened/closed relative to the main portion 20a. The front cover 20b consists of an inclined plate 20c on the upper side and a vertical plate 20d on the lower side, and is connected to the front end of the main portion 20a by a hinge 27 at the upper end of the inclined plate 20c, such that the front cover 20b is opened/closed by moving up and down. A handle 42 is arranged on the outer surface of the vertical plate 20d to assist an operation of opening/closing the front cover 20b.

At the lower end of the vertical plate 20d on the lower side, a mount portion 29 is arranged to allow the measuring unit 50, which will be described later, to be detachably set up. The mount portion 29 has an opening, formed at the bottom of the front side of the lamp chamber 20 and extending laterally, which is opened/closed by moving a slide door 28 up and down. A measurement space 31 is defined between the window 10 and the lamps 21 in the lamp chamber 20, to correspond to the mount portion 29. The measurement space 31 allows a light-quantity sensor 30 attached to the distal end of the measuring unit 50 for measuring the light quantity of the lamps 21 to be detachably inserted therein.

An ultraviolet-ray shield 45 is attached on the front cover 20b of the lamp chamber 20, for protecting the eyes of an operator from ultraviolet rays leaking from the opening of the mount portion 29. The shield 45 is formed of a sunglass-like member for shielding ultraviolet rays, which is connected by a hinge 46 to be rotatable up and down at the boundary between the inclined plate 20c and the vertical plate 20d of the front cover 20b. A knob 47 is arranged at the distal end of the shield 45 to assist an operation of turning the shield 45. When used, the shield 45 is turned forward and downward, and is kept at a necessary inclined position by abutting against the handle 42, as indicated with a solid line in FIG. 3. On the other hand, when unused, the shield 45 is turned backward and upward, and is held on the inclined plate 20c, as indicated with a one-dot chain line in FIG. 3.

Figure 5:
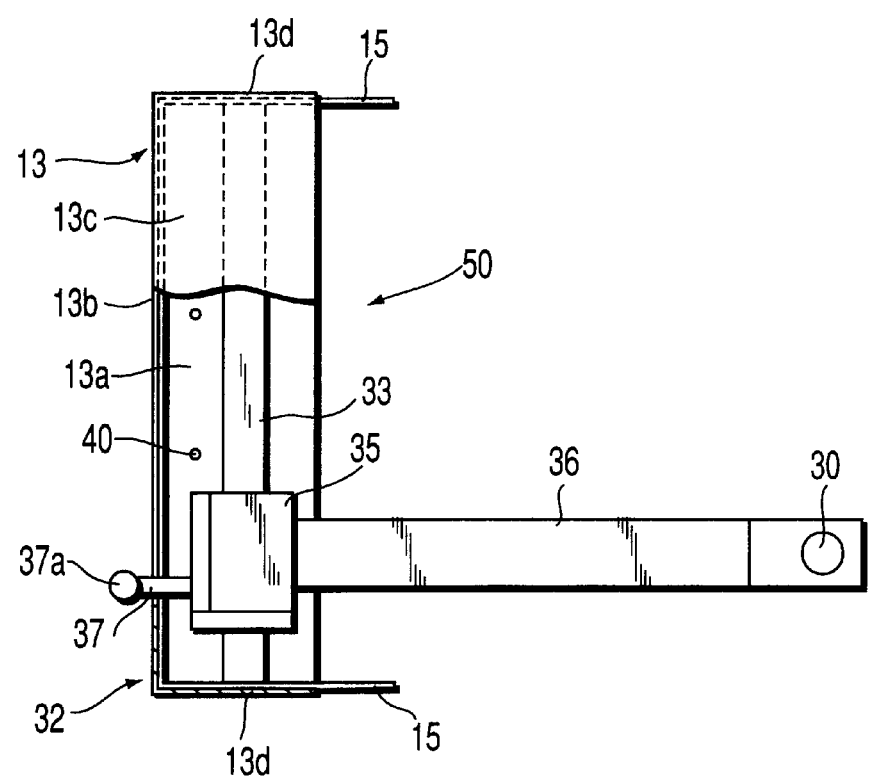
FIG. 5 is a plan view showing the measuring unit to be used in the apparatus shown in FIG. 1.
Figure 6:
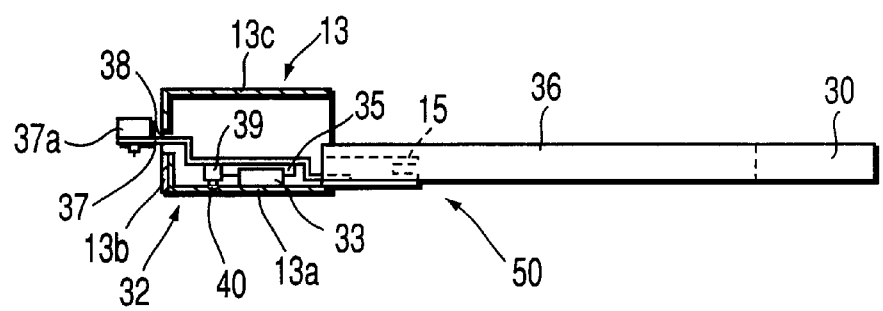
FIG. 6 is a sectional side view showing the measuring unit shown in FIG. 5.

FIGS. 5 and 6 are a plan view and a sectional side view, respectively, showing the measuring unit 50. The measuring unit 50 includes a base portion 32, which is used for closing the opening of the mount portion 29 of the lamp chamber 20, and supporting the light-quantity sensor 30 to be operable. The base portion 32 is formed of a casing defined by a bottom wall 13a, a front wall 13b, a top wall 13c, and right and left side walls 13d, and thus has a C-shape in its cross section and an opening on one side. The casing has a size slightly larger than that of the opening of the mount portion 29 to close the opening. A pair of positioning plates 15 are arranged one on either side of the casing 13 to engage with pins 14 protruding from the sides of the lamp chamber 20, thereby positioning the casing 13.

In the casing 13, there is a guide rail 33 on which a slider 35 is supported to be movable along. An arm 36 is fixed to the slider 36 to extend in a direction opposite to the direction toward the front wall 13b, and is provided with the sole light-quantity sensor 30 at its distal end to face upward. A signal cable from the light-quantity sensor 30 is guided through the arm 36, led out from the casing 13, and is connected to a measuring apparatus (not shown). Furthermore, an operation lever (operation member) 37 is connected to the slider 35 to extend out from the front wall 13b. A slit is formed in the front wall 13b and extends laterally, through which the distal end of the operation lever 37 protrudes and is provided with a knob 37a.

The guide rail 33 is designed to extend parallel to the window 10 and in a direction in which the lamps 21 are arrayed, in a state where the measuring unit 50 is set up in the mount portion 29. Accordingly, the light-quantity sensor 30 can be moved directly under the lamps 21 in the direction in which the lamps 21 are arrayed, when the slider 35 is moved along the guide rail 33 by the operation lever 37.

In order to position the light-quantity sensor 30 at the respective lamps 21, a positioning mechanism is arranged between the casing 13 and the slider 35. The positioning mechanism includes a ball plunger 39 attached on the bottom of the slider 35. On the other hand, recessed portions 40, to engage with the ball plunder 39, are formed at positions corresponding to respective lamps 21 on the bottom wall 13a of the casing 13. When the ball plunger 39 engages with each recessed portion 40, the slider 35 is temporarily stopped with a click sound. In other words, the positioning mechanism constitutes a so-called click-stop.

Explanations will be given of an oxidizing method and a method of measuring the light-quantity of the UV lamps in the ozone-processing apparatus shown in FIG. 1.

Where a semiconductor wafer W is subjected to an oxidizing process in this apparatus, the wafer W is first loaded into the process chamber 1 through the opening 7 with the gate valve 8 being opened, by a transfer arm (not shown) arranged in an adjacent transfer chamber. The wafer W is then mounted on the worktable 3, and attracted and held thereon by the electrostatic chuck. Then, the wafer W is maintained at a predetermined process temperature by the heating means, while the process chamber 1 is vacuum-exhausted to be a predetermined process pressure, and a process gas containing ozone as the main component is supplied, thereby starting the oxidizing process. During the process, the process gas containing ozone ($O_3$) generated in the ozone generator is introduced into the showerhead 5 through the gas supply pipe 6a, and is spouted from a number of spouting holes toward the wafer W in the process field S.

While the process gas is being supplied, the lamps 21 in the lamp chamber 20 are lit to emit ultraviolet rays. In the lamp chamber 20, a cooling gas, such as air, is caused to flow from the gas supply port 22 to the exhaust port 23 by the blower 24, so as to keep the surface temperature of the lamps 21 within a certain range. Ultraviolet rays emitted from the lamps 21 are transmitted through the quartz window 10 into the process chamber 1, and further transmitted through the quartz shower head 5, and are radiated to the process gas containing ozone as the main component. The ozone is excited by the radiation of ultraviolet rays to generate a great amount of activated oxygen, with which the surface of the wafer W on the worktable 3 is subjected to the oxidizing process.

On the other hand, where the light-quantity of the UV lamps 21 is measured in this apparatus, the slide door 28 is lifted up to open the mount portion 29 at the bottom of the lamp chamber 20. Then, the measuring unit 50 is set up in the mount portion 29, such that the light-quantity sensor 30 is inserted into the measurement space 31 between the lamps 21 and the window 10. At this time, the casing 13 forming the base portion 32 of the measuring unit 50 closes the opening of the mount portion 29. Consequently, it is possible to reliably prevent gases and ultraviolet rays from leaking from the lamp chamber 20. Furthermore, the UV shield 45 is turned forward and downward to shield ultraviolet rays leaking from a gap between the base portion 32 and the mount portion 29.

Then, an operation starts to measure the light quantity of the UV lamps 21 by the light-quantity sensor 30. The sensor 30 is moved along with the slider 35 and the arm 36 by the operation lever 37, along the guide rail 33, and is placed at positions directly under the respective lamps 21 in sequence. The positioning mechanism constituting a click-stop combined with the slider 35 assists an operator in readily stopping the sensor 30 at the respective positions corresponding to the lamps 21.

According to the ozone-processing apparatus shown in FIG. 1, the interior of the process chamber 1 is not exposed to the atmosphere when the light quantity of the UV lamps 21 is measured, thereby preventing the processing environment in the process chamber and the operation environment around the process chamber from being deteriorated. Furthermore, it is not necessary to purge the process chamber 1 with nitrogen gas when the light quantity of the UV lamps 21 is measured, thereby making the operation easier, and reducing the operation cost and the downtime of the apparatus.

The base portion 32 of the measuring unit 50 and the UV shield 45 prevent gases and ultraviolet rays from leaking from the lamp chamber 20, thereby securing the operation. The shield 45 is arranged as an auxiliary member on the lamp chamber 20, and thus can be readily used. The sole light-quantity sensor 30 is use for all the lamps 21 to measure their light quantity one by one, thereby reducing the cost.

Figure 7:
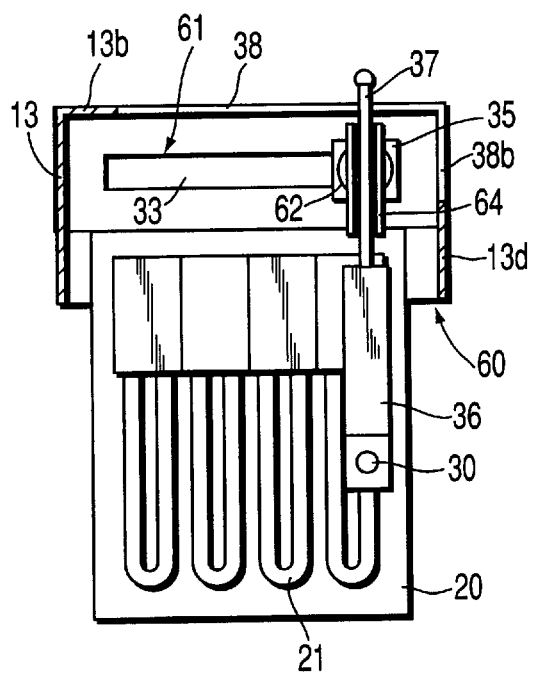
FIG. 7 is a sectional plan view showing the main part of an ozone-processing apparatus according to another embodiment of the present invention.
Figure 8:
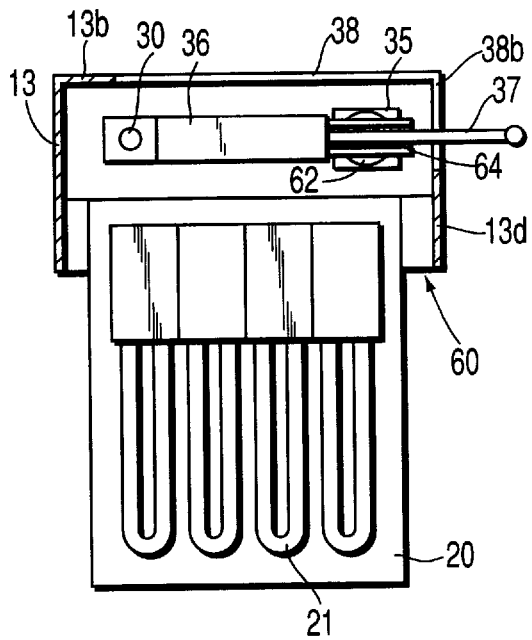
FIG. 8 is a sectional plan view showing the main part of the apparatus shown in FIG. 7 in a different state.

FIGS. 7 and 8 are sectional plan views showing the main part of an ozone-processing apparatus according to another embodiment of the present invention, in different states. This embodiment is characterized in that a space for accommodating a light-quantity sensor and an arm is prepared in the base portion of a measuring unit.

In a measuring unit 60 shown in FIGS. 7 and 8, a slider 35 arranged on a guide rail 33 is provided with a rotational table 62 thereon, and a linear guide 64 on the rotational table 62. The linear guide 64 includes a first portion fixed to the rotational table 62, and a second portion supported by the first portion to be linearly movable relative thereto and connected to an arm 36. An operation lever 37 is integrated with the arm 36 by the second portion of the linear guide 64. Accordingly, the arm 36 and the operation lever 37 can be moved in the angular direction and the linear direction relative to the slider 35 in a plane parallel to the window by the rotational table 62 and the linear guide 64. A measuring unit 50 includes a casing 13 with a front wall 13b and a side wall 13d having a slit 38 and a slit 38b, respectively, continuous to each other, so as to allow the operation lever 37 to be rotated.

Where the light-quantity of UV lamps 21 is measured by the measuring unit 60, the arm 36 is set to extend perpendicular to the guide rail 33, as shown in FIG. 7. Furthermore, the arm 36 is pushed toward the lamps 21 by the operation lever 37, so that the light-quantity sensor 30 is positioned in the measurement space 31 and directly under the center of the lamps 21. With this operation, an arrangement of the arm 36 and the sensor 30, which is almost the same as that of the measuring unit 50 of the previous embodiment, is obtained in the measuring unit 60. Consequently, the measuring unit 60 is operated in accordance with the method described above with reference to the measuring unit 50, so that the light quantity is measured.

On the other hand, where a semiconductor wafer W is subjected to a process, the light-quantity sensor 30 and the arm 36 are obstacles that block ultraviolet rays, and thus they have to be retreated. In this case, the arm 36 is pulled toward the casing 13 and rotated on the slider 35 by the operation lever 37, so that the arm 36 is set to extend parallel to the guide rail 33. With this operation, the arm 36 is accommodated in the casing 13 of the measuring unit 50, so that it does not obstruct the process on the wafer W. In other words, the space above the guide rail 33 in the casing 13 of the measuring unit 60 functions as a accommodation space 61 for accommodating the light-quantity sensor 30 and the arm 36.

According to this embodiment, the light-quantity sensor 30 can be inserted/retreated into/from the measurement space 31 without detaching the measuring unit 60 from the lamp chamber 20, thereby further improving the operability of the ozone-processing apparatus.

Figure 9:
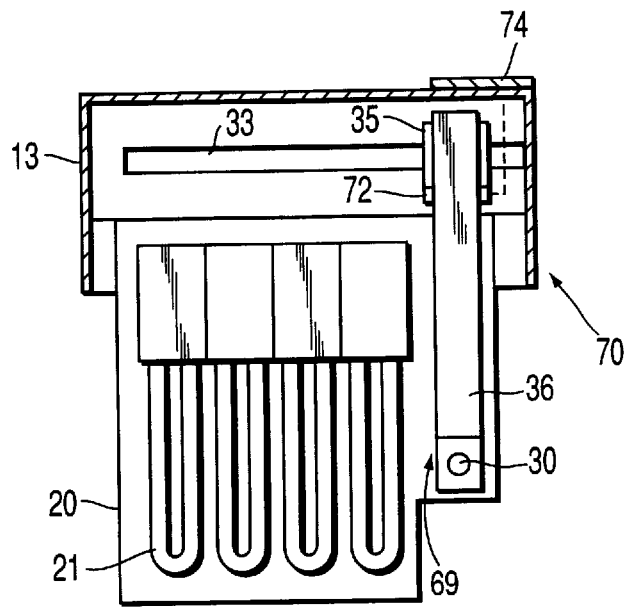
FIG. 9 is a sectional plan view showing the main part of an ozone-processing apparatus according to still another embodiment of the present invention.

FIG. 9 is a sectional plan view showing the main part of an ozone-processing apparatus according to still another embodiment of the present invention. This embodiment is characterized in that a space for retreating a light-quantity sensor and an arm is prepared in a lamp chamber.

In a lamp chamber 20 shown in FIG. 9, a retreat space 69 for retreating a light-quantity sensor 30 and an arm 36 is formed at one end in a direction in which UV lamps 21 are arrayed. Furthermore, in the measuring unit 70 shown in FIG. 9, a slider 35 arranged on a guide rail 33 is provided with no operation lever 37, but with a motor 72 for driving the slider 35 in place thereof. The motor 72 is operated by a specific button arranged on a control panel 74 prepared on the outer surface of the casing 13 of the measuring unit 70. Since no operation lever 37 is used, the casing 13 has no slit 38 for the operation lever 37.

Where the light-quantity sensor 30 and the arm 36 are retreated from a measurement space in the measuring unit 70, they are moved into the retreat space 60 in the lamp chamber 20. This operation is performed by moving the slider 35 along the guide rail 33 to a position out of the lamps 21, while pushing the specific button on the control panel 74.

According to this embodiment, the light-quantity sensor 30 can be inserted/retreated into/from the measurement space 31 without detaching the measuring unit 70 from the lamp chamber 20, thereby further improving the operability of the ozone-processing apparatus. Besides, the casing 13 of the measuring unit 70 has no slit 38, through which gases and ultraviolet rays leak from the lamp chamber 20, thereby providing a better operation environment.

Note that, although the UV source of the above-described embodiments is formed of a plurality of lamps, the UV source may be formed of a combination of one lamp and a reflection mirror. Further, although the ozone-processing apparatus of the embodiments constitutes an oxidizing apparatus, the present invention is applicable to other apparatuses, such as a reforming apparatus, a diffusing apparatus, a film forming apparatus, etc., in which a process is performed with ozone. Furthermore, the target substrate is not limited to a semiconductor wafer, but includes a glass substrate, an LCD substrate, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ozone-processing apparatus for a semiconductor process system, comprising:

an airtight process chamber;

a support member configured to support a target substrate within said process chamber;

a supply mechanism configured to supply a process gas containing ozone into said process chamber;

an exhaust mechanism configured to exhaust said process chamber;

a window configured to transmit ultraviolet rays and formed in a wall defining said process chamber;

an auxiliary chamber arranged on said process chamber, such that said process and auxiliary chambers are partitioned by said window;

a light source configured to emit ultraviolet rays and disposed in said auxiliary chamber to face said window, such that a measurement space is defined between said window and said light source in said auxiliary chamber; and a measuring unit including a sensor configured to measure light quantity of said light source, and to be detachably inserted into said measurement space.

2. The apparatus according to claim 1, wherein said measuring unit comprises a base portion configured to attach said measuring unit to said auxiliary chamber, and a connecting portion configured to connect said sensor to said base portion such that said sensor is movable in said measurement space.

3. The apparatus according to claim 2, wherein said connecting portion comprises an arm supporting said sensor, and a first guide configured to guide said arm such that said arm is movable substantially parallel to the window and in a first direction.

4. The apparatus according to claim 3, wherein said connecting portion comprises a rotational table configured to be movable along said first guide, and to support said arm to be rotatable substantially parallel to the window.

5. The apparatus according to claim 3, wherein said connecting portion comprises a second guide configured to guide said arm such that said arm is movable substantially parallel to the window and in a second direction perpendicular to the first direction.

6. The apparatus according to claim 3, wherein said light source comprises a plurality of ultraviolet-ray lamps arrayed along said window and in said first direction.

7. The apparatus according to claim 6, wherein said connecting portion comprises a positioning mechanism configured to position said sensor correspondingly to the respective ultraviolet-ray lamps.

8. The apparatus according to claim 7, wherein said positioning mechanism comprises a click-stop incorporated with said arm.

9. The apparatus according to claim 2, wherein said measuring unit comprises an operation lever configured to allow an operation for moving said sensor in said measurement space to be performed from outside of said auxiliary chamber.

10. The apparatus according to claim 1, wherein said auxiliary chamber comprises an ultraviolet-ray shield configured to protect eyes of an operator handling said operation lever from ultraviolet rays.

11. The apparatus according to claim 2, wherein said measuring unit comprises a motor configured to give a driving force for moving said sensor in said measurement space.

12. The apparatus according to claim 1, wherein said auxiliary chamber comprises a mount portion configured to allow said measuring unit to be detachably set up therein, such that said sensor is inserted/retreated into/from said measurement space when said measuring unit is attached/detached to/from said mount portion.

13. The apparatus according to claim 2, wherein said measuring unit comprises an accommodation space for accommodating said sensor, such that said sensor is inserted/retreated into/from said measurement space when said sensor is moved between said measurement space and said accommodation space.

14. The apparatus according to claim 13, wherein said connecting portion comprises an arm configured to support said sensor and to be rotatable along said window, such that said sensor is inserted/retreated into/from said measurement space by rotating said arm.

15. The apparatus according to claim 2, wherein said auxiliary chamber comprises a retreat space for retreating said sensor, such that said sensor is inserted/retreated into/from said measurement space when said sensor is moved between said measurement space and said retreat space.

16. The apparatus according to claim 15, wherein said connecting portion comprises an arm configured to support said sensor and to be movable along said window, such that said sensor is inserted/retreated into/from said measurement space by moving said arm.

17. An ozone-processing apparatus for a semiconductor process system, comprising:

an airtight process chamber;

a support member configured to support a target substrate within said process chamber;

a supply mechanism configured to supply a process gas containing ozone into said process chamber;

an exhaust mechanism configured to exhaust said process chamber;

a window configured to transmit ultraviolet rays and formed in a wall defining said process chamber;

an auxiliary chamber arranged on said process chamber, such that said process and auxiliary chambers are partitioned by said window;

a light source configured to emit ultraviolet rays and disposed in said auxiliary chamber to face said window, such that a measurement space is defined between said window and said light source in said auxiliary chamber, said light source comprising a plurality of ultraviolet-ray lamps arrayed along said window and in a first direction; and a measuring unit including a sensor configured to measure light quantity of said light source, and to be detachably inserted into said measurement space, said measuring unit comprising an arm supporting said sensor, and a first guide configured to guide said arm such that said arm is movable substantially parallel to the window and in said first direction.

18. The apparatus according to claim 17, wherein said measuring unit comprises a click-stop incorporated with said arm and configured to position said sensor correspondingly to the respective ultraviolet-ray lamps.

19. The apparatus according to claim 17, wherein said measuring unit comprises an accommodation space for accommodating said arm, such that said sensor is inserted/retreated into/from said measurement space when said arm is moved between said measurement space and said accommodation space.

20. The apparatus according to claim 19, wherein said measuring unit comprises a rotational table configured to be movable along said first guide, and to support said arm to be rotatable substantially parallel to the window, such that said sensor is inserted/retreated into/from said measurement space by rotating said arm.

21. A method of measuring light quantity of ultraviolet rays in an ozone-processing apparatus for a semiconductor process system, wherein said apparatus comprises an airtight process chamber, a support member configured to support a target substrate within said process chamber, a supply mechanism configured to supply a process gas containing ozone into said process chamber, an exhaust mechanism configured to exhaust said process chamber, a window configured to transmit ultraviolet rays and formed in a wall defining said process chamber, an auxiliary chamber arranged on said process chamber, such that said process and auxiliary chambers are partitioned by said window, and a light source configured to emit ultraviolet rays and disposed in said auxiliary chamber to face said window, said method comprising the steps of:

securing a measurement space between said window and said light source in said auxiliary chamber, such that a sensor configured to measure light quantity of said light source is detachably inserted into said measurement space;

inserting said sensor into said measurement space from outside of said measurement space; and measuring the light quantity of said light source by said sensor.

22. The method according to claim 21, wherein said light source comprises a plurality of ultraviolet-ray lamps arrayed along said window and in a first direction, and said step of measuring the light quantity comprises a step of measuring light quantity of said lamps while moving said sensor in said first direction.

* * * * *

UNITED STATES PATENT AND TRADEMARK OFFICE
CERTIFICATE OF CORRECTION

PATENT NO. : 6,224,934 B1
DATED : May 1, 2001
INVENTOR(S) : Hasei et al.

It is certified that error appears in the above-identified patent and that said Letters Patent is hereby corrected as shown below:

Title page,
Item [30], the Foreign Application Priority Data should read as follows:
-- Item [30] Foreign Application Priority Data
Jun. 7, 1999    (JP) .......................................................... 11-158851 --

Signed and Sealed this

Twenty-seventh Day of November, 2001

Attest:

*Nicholas P. Godici*

NICHOLAS P. GODICI
*Attesting Officer*    *Acting Director of the United States Patent and Trademark Office*

UNITED STATES PATENT AND TRADEMARK OFFICE
CERTIFICATE OF CORRECTION

PATENT NO. : 6,224,934 B1
DATED : May 1, 2001
INVENTOR(S) : Masaaki Hasei et al.

It is certified that error appears in the above-identified patent and that said Letters Patent is hereby corrected as shown below:

<u>Title page,</u>
Please change Item [75], to read  -- Masaaki Hasei, Tsukui-gun; Kenji Ishikawa, Sagamihara-shi; Shou-Qian Shao, Sagamihara-shi; Tetsuya Nakano, Sagamihara-shi, all of (JP) --

Signed and Sealed this

Sixth Day of January, 2004

JAMES E. ROGAN
*Director of the United States Patent and Trademark Office*